United States Patent
Cho

(10) Patent No.: US 7,585,727 B2
(45) Date of Patent: Sep. 8, 2009

(54) METHOD FOR FABRICATING SEMICONDUCTOR DEVICE HAVING BULB-SHAPED RECESS GATE

(75) Inventor: Jun-Hee Cho, Ichon-shi (KR)

(73) Assignee: Hynix Semiconductor Inc., Icheon-si (KR)

( * ) Notice: Subject to any disclaimer, the term of this patent is extended or adjusted under 35 U.S.C. 154(b) by 214 days.

(21) Appl. No.: 11/617,595

(22) Filed: Dec. 28, 2006

(65) Prior Publication Data

US 2007/0232042 A1    Oct. 4, 2007

(30) Foreign Application Priority Data

Mar. 31, 2006   (KR) .................. 10-2006-0029869

(51) Int. Cl.
*H01L 21/336* (2006.01)
(52) U.S. Cl. ...................... 438/259; 438/270
(58) Field of Classification Search .......... 438/699, 438/303, 107, 259, 270, 576, 589; 257/506
See application file for complete search history.

(56) References Cited

U.S. PATENT DOCUMENTS

| 4,990,462 | A | * | 2/1991 | Sliwa, Jr. ............. 438/107 |
| 5,639,345 | A | * | 6/1997 | Huang et al. .......... 438/699 |
| 6,022,782 | A | * | 2/2000 | Smith et al. ........... 438/303 |
| 6,437,417 | B1 | * | 8/2002 | Gilton ................. 257/506 |

FOREIGN PATENT DOCUMENTS

| CN | 1218274 | 6/1999 |
| CN | 1649111 | 8/2005 |
| KR | 10-2000-0060693 A | 10/2000 |
| KR | 10-2006-0023308 A | 3/2006 |

\* cited by examiner

*Primary Examiner*—Evan Pert
*Assistant Examiner*—Monica D Harrison
(74) *Attorney, Agent, or Firm*—Townsend and Townsend and Crew LLP

(57) ABSTRACT

A method for fabricating a semiconductor device includes etching a portion of a substrate to form a recess. A polymer layer fills a lower portion of the recess. Sidewall spacers are formed over the recess above the lower portion of the recess. The polymer layer is removed. The lower portion of the recess is isotropically etching to form a bulb-shaped recess.

12 Claims, 5 Drawing Sheets

METHOD FOR FABRICATING SEMICONDUCTOR DEVICE HAVING BULB-SHAPED RECESS GATE

CROSS-REFERENCE TO RELATED APPLICATIONS

The present invention claims priority to Korean patent application number 10-2006-0029869, filed on Mar. 31, 2006 which is incorporated herein by reference in its entirety.

BACKGROUND OF THE INVENTION

The present invention relates to a method for fabricating a semiconductor device; and more particularly, to a method for fabricating a semiconductor device having a bulb-shaped recess gate.

In a conventional method for forming a planar gate interconnection line, a gate is formed over a flat active region. The current demand for large scale integration of semiconductor devices has caused a decrease in channel length and an increase in implantation doping concentration. A junction leakage is often generated due to an increased electric field. Thus, it becomes difficult to secure a satisfactory refresh property of a device. Furthermore, a channel length and a channel width are restricted, and electron mobility is reduced due to the increased channel doping concentration. As a result, it is desired to secure a sufficient channel current.

FIGS. 1A and 1B are cross-sectional views illustrating a conventional method for fabricating a semiconductor device having bulb-shaped recess gates. As shown in FIG. 1A, a pad oxide layer 12 and a hard mask 13, each exposing regions where recesses are to be formed, are formed over a substrate 11. The substrate 11 is etched using the hard mask 13 as an etch mask to form a plurality of first recesses 14 having vertical profiles. While the first recesses 14 are formed, plasma damage A1 may be incurred on sidewalls of the first recesses 14 (i.e., junction regions).

As shown in FIG. 1B, the substrate 11 beneath the first recesses 14 is subjected to an isotropic etching process to form a plurality of second recesses 15 having round profiles. While the second recesses 15 are formed, plasma damage A2 may also be incurred on the junction regions.

FIG. 2 is a transmission electron micrograph (TEM) illustrating a semiconductor device having typical bulb-shaped recess gates. Given portions of a substrate are selectively subjected to a plasma etching process to form the semiconductor device having the bulb-shaped recess gates 100. The semiconductor device having the bulb-shaped recess gates 100 has an increased channel length such that a junction region may not shrink.

Since the bulb-shaped recess gates 100 are formed using a plasma dry etching process, plasma damage may be incurred twice. The plasma damage may degrade transistor quality. If polymers are deposited over lower portions of the recesses during the etching process, the bulb-shaped recess gates 100 may be formed at a size that is smaller than desired. Alternatively, the bulb-shaped recess gates 100 may not be formed at all.

SUMMARY OF THE INVENTION

An embodiment of the present invention provides a method for fabricating a semiconductor device having a bulb-shaped recess gate. Plasma damage that may be incurred on a junction region of the recess gate is reduced. The recess gate is prevented from being formed with a size that is smaller than desired or not formed at all.

In accordance with one aspect of the present invention, a method for fabricating a semiconductor device is provided. The method includes etching a portion of a substrate to form a recess. A polymer layer fills a lower portion of the recess. Sidewall spacers are formed over sidewalls of the recess above the lower portion of the recess. The polymer layer is removed. The lower portion of the recess is isotropically etched to form a bulb-shaped recess.

In accordance with another aspect of the preset invention, a method for fabricating a semiconductor device is provided. A portion of a substrate is etched to form a recess having an upper portion and a lower portion. A polymer layer that fills the lower portion of the recess while exposing the upper portion of the recess is formed. A film is formed on sidewalls of the upper portion of the recess. The polymer layer is removed to expose the lower portion of the recess. The exposed lower portion of the first recess is isotropically etched to form a bulb-shaped second recess. The film on the sidewalls of the upper portion of the recess prevents the sidewalls of the upper portion of the recess from being etched while the exposed lower portion is being etched isotropically.

DESCRIPTION OF SPECIFIC EMBODIMENTS

Figure 1A:
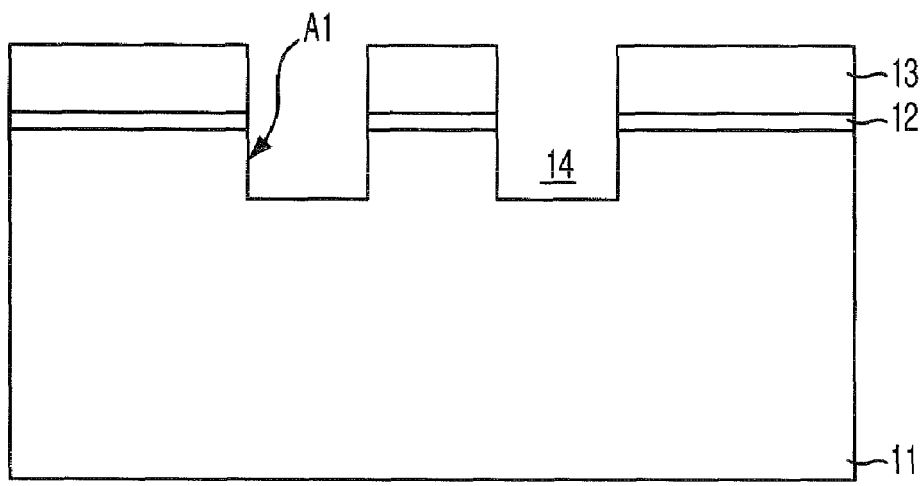
FIGS. 1A and 1B are cross-sectional views illustrating a method for fabricating a semiconductor device having conventional bulb-shaped recess gates.
Figure 1B:
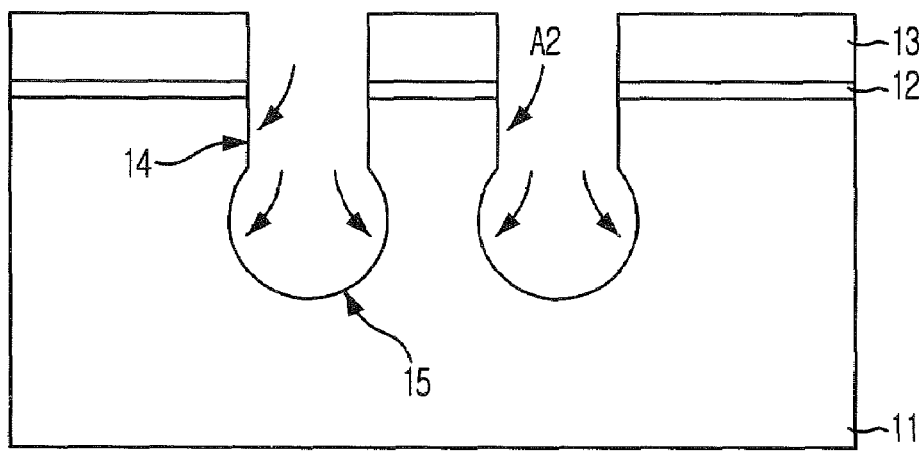
Figure 2:
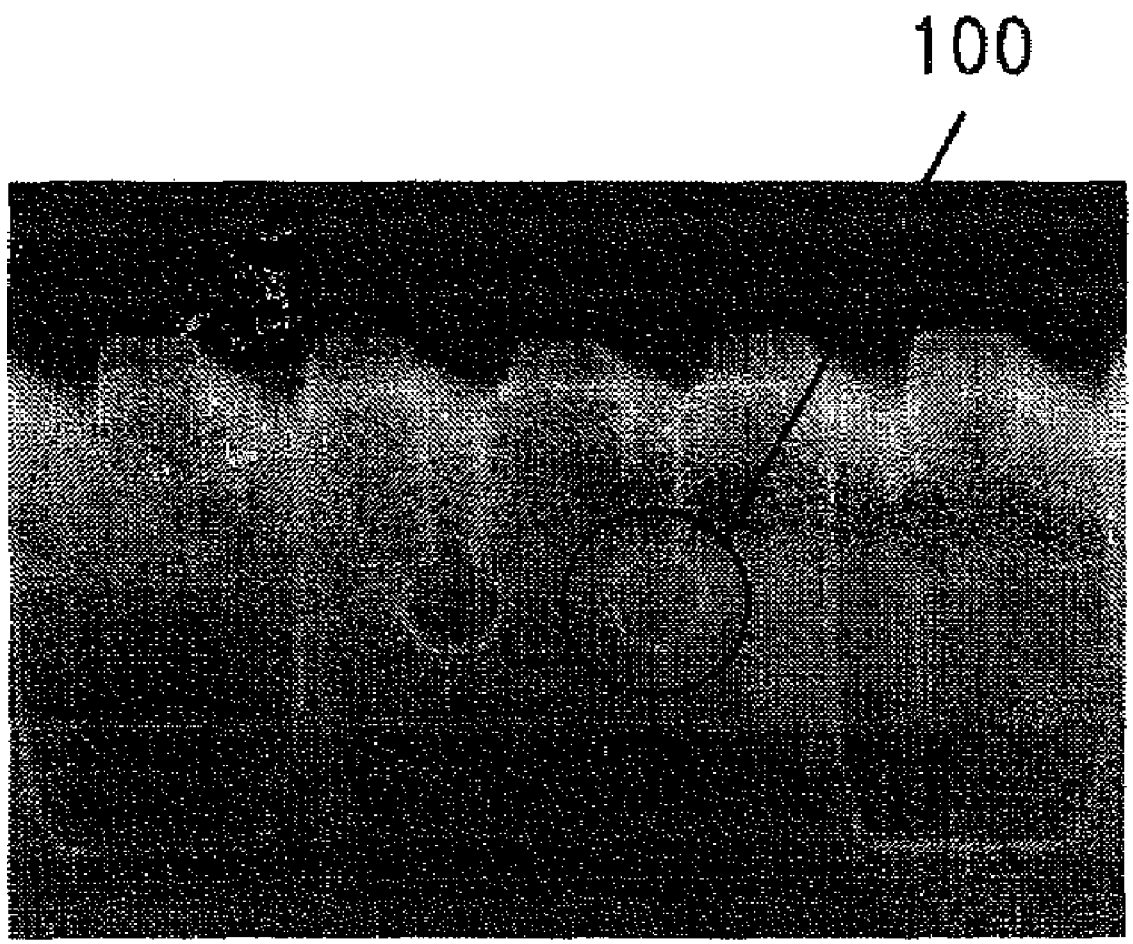
FIG. 2 is a transmission electron micrograph illustrating conventional bulb-shaped recess gates.
Figure 3A:
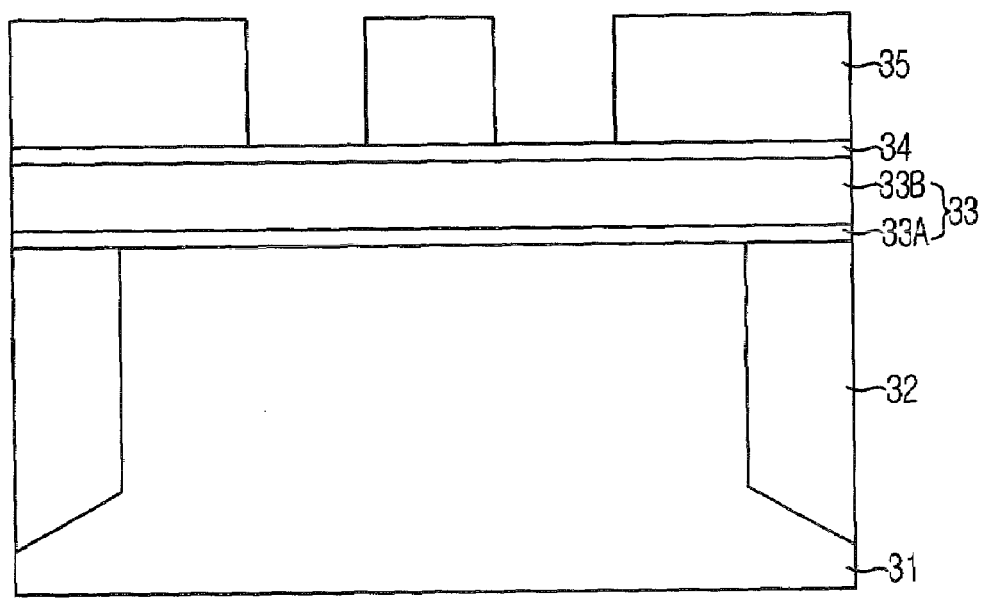
FIGS. 3A to 3F are cross-sectional views illustrating a method for fabricating a semiconductor device having bulb-shaped recess gates in accordance with an embodiment of the present invention.

FIGS. 3A to 3F are cross-sectional views illustrating a method for fabricating a semiconductor device having bulb-shaped recess gates in accordance with an embodiment of the present invention. As shown in FIG. 3A, a shallow trench isolation (STI) process is performed on a substrate 31 to form an isolation structure 32. The isolation structure 32 defines an active region, and is formed at a depth that is greater than subsequent recesses (e.g., first recesses 36).

A hard mask layer 33 is formed over the substrate 31. The hard mask layer 33 is formed with a stack structure including a first hard mask layer 33A and a second hard mask layer 33B. The first hard mask layer 33A may include a dielectric-based hard mask layer, and the second hard mask layer 33B may include a silicon-based hard mask layer. Particularly, the first hard mask layer 33A is thinly formed using a dielectric material that may include a nitride layer or an oxide layer. The second hard mask layer 33B may include polycrystalline silicon.

If only the second hard mask layer 33B is formed as a hard mask layer, the substrate 31 and the second hard mask layer 33B may not be easily separated from each other. As a result, a certain portion of the substrate 31 may be damaged when the second hard mask layer 33B is removed after first recesses are formed. Therefore, the hard mask layer 33 is formed in the stack structure.

An anti-reflective coating layer 34 is formed over the hard mask layer 33 to prevent reflection during a photo-exposure process to form a subsequent photoresist pattern. The anti-reflective coating layer 34 may include an organic-based material. A photoresist pattern 35 is formed over the anti-reflective coating layer 34. The photoresist pattern 35 exposes regions where the subsequent first recesses are to be formed. The photoresist pattern 35 may include a cycloolefin-maleic anhydride or a acrylate-based polymer. A photo-exposure process using ArF is performed to form a bar-type or T-type photoresist pattern 35.

Figure 3B:
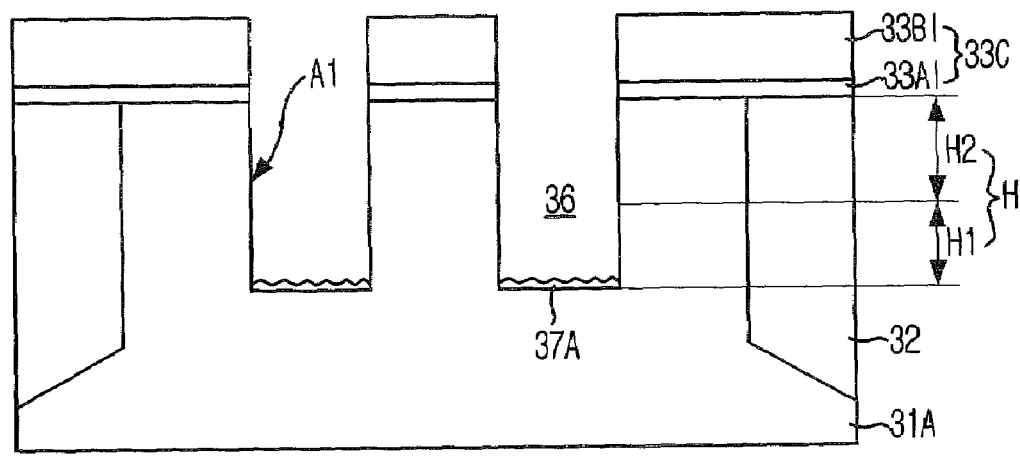

As shown in FIG. 3B, the anti-reflective coating layer 34 and the hard mask layer 33 are etched using the photoresist pattern 35 as an etch mask. The photoresist pattern 35 and the anti-reflective coating layer 34 are removed. A hard mask pattern 33C (including a first hard mask pattern 33A1 and a second hard mask pattern 33B1) is formed by the etching of the hard mask layer 33.

The substrate 31 is etched using the hard mask pattern 33C as an etch mask to form a plurality of first recesses 36. The patterned substrate is identified by reference numeral 31A. Each of the first recesses 36 has a vertical profile, and is formed nearly to a final recess depth H. The final recess depth H includes a depth H2 of an upper substrate portion and another depth H1 of a lower substrate portion where bulb-shaped second recesses are to be formed. The etching of the substrate 31 to form the first recesses 36 is performed by a plasma-based dry etching process using hydrogen bromide (HBr). During the dry etching process, first polymers 37A may be generated and deposited over bottom portions of the first recesses 36. While forming the first recesses 36, plasma damage A1 may be incurred over junction regions (i.e., sidewalls of the first recesses 36).

Figure 3C:
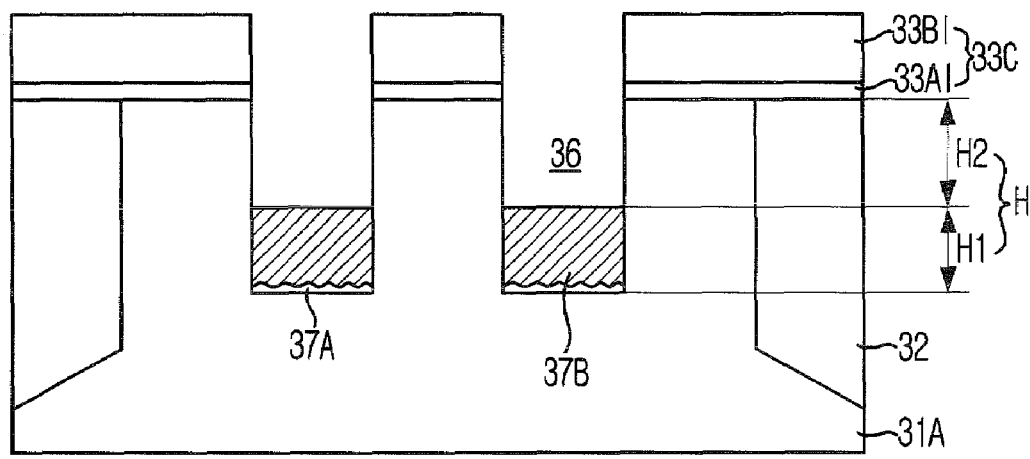

As shown in FIG. 3C, second polymers 37B are deposited over lower portions of the first recesses 36. The second polymers 37B may include a carbon-based material containing at least approximately 80% of carbon. The second polymers 37B may include amorphous carbon.

To form the second polymers 37B, a polymer layer is formed over the hard mask pattern 33C and fills the first recesses 36. An etch back process is performed such that the second polymers 37B remain in the lower portions of the first recesses 36. The etch back process is performed using a gas mixture of nitrogen ($N_2$) and oxygen ($O_2$) at a flow rate having a range of approximately 10 sccm to approximately 1,000 sccm.

The etch back process is performed until the second polymers 37B remain only in the portions of the first recesses 36 where the bulb-shaped second recesses are to be formed. The gas mixture of $N_2$ and $O_2$ used to etch the second polymers 37B has a higher etch selectivity relative to other layers (e.g., the hard mask pattern 33C and the patterned substrate 31A). As a result, the etch back process is performed without damaging the lower layers.

Figure 3D:
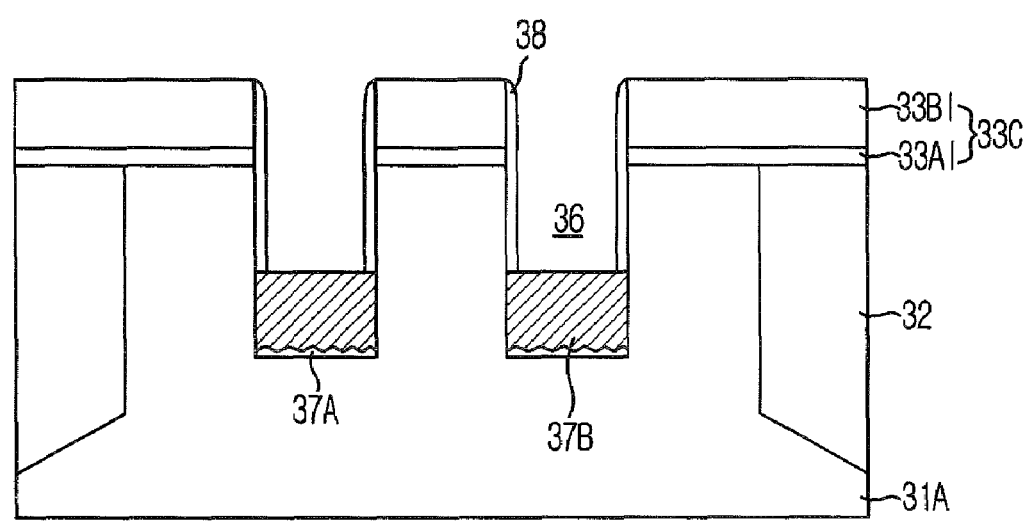

As shown in FIG. 3D, spacers 38 are formed over sidewalls of the hard mask 33C and the sidewalls of the substrate portions where the first recesses 36 maintain the vertical profile (i.e., along depth H2). The spacers 38 are formed to prevent damage to the sidewalls of the first recesses 36 when a plasma dry etching process is performed to form the bulb-shaped second recesses. An insulation layer is formed over a surface including the first recesses 36. An etch back process is performed to form the spacers 38. The spacers 38 may include a nitride layer.

Figure 3E:
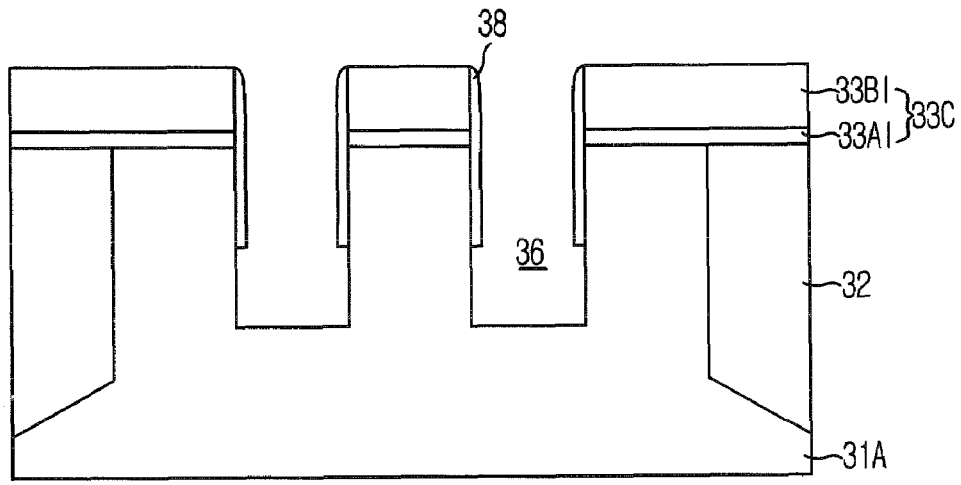

As shown in FIG. 3E, the second polymers 37B that are deposited in the lower portions of the first recesses 36 are removed via a stripping process using oxygen plasma. The first polymers 37A generated during the formation of the first recesses 36 may also be removed simultaneously with the removal of the second polymers 37B.

After the second polymers 37B are removed, the spacers 38 remain only over the sidewalls of upper portions of the first recesses 36. The spacers 38 do not extend to the lower portions of the first recesses 36 where the bulb-shaped second recesses are to be formed. Therefore, the lower sidewalls of the first recesses 36 are uncovered. Accordingly, a subsequent etching process which transforms the lower portions of the first recesses 36 into the bulb-shaped second recesses can be easily performed.

Figure 3F:
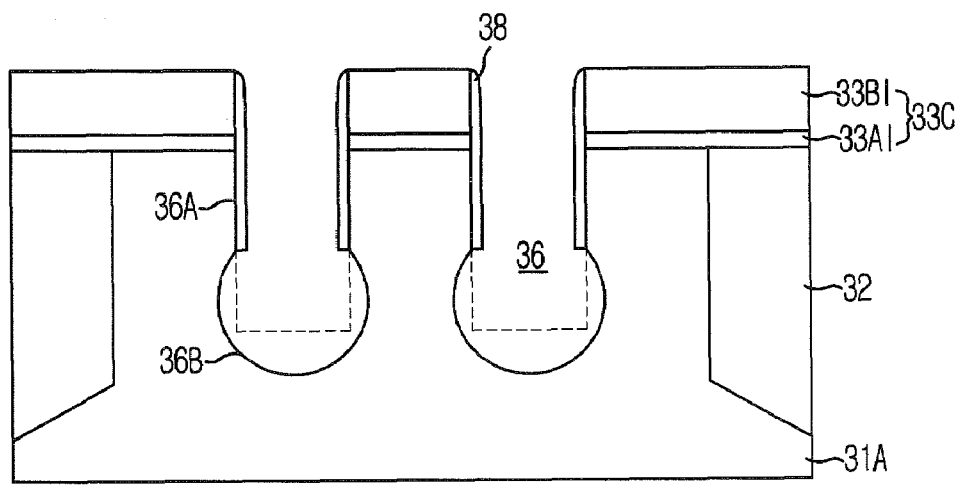

As shown in FIG. 3F, the lower portions of the first recesses 36 are isotropically etched to become more rounded and wider than the upper portions 36A of the first recesses 36. Reference numeral 36B identifies the lower portions of the first recesses 36 that are rounded and wider due to the isotropic etching (i.e., the bulb-shaped second recesses).

During the isotropic etching process to form the widened lower portions 36B of the first recesses 36, the spacers 38 remain over the upper sidewalls of the first recesses 36. As a result, the upper sidewalls of the first recesses 36 are protected. Thus, plasma damage, which is usually incurred when the plasma dry etching process is performed, is prevented. Since the isotropic etching process is performed when the first polymers 37A and the second polymers 37B are removed simultaneously, the bulb-shaped second recesses 36B are formed with uniform profiles.

As described above, the spacers 38 are formed over the upper sidewalls of the first recesses 36, thereby preventing damage to the substrate 31 during a plasma dry etching process performed to form the bulb-shaped second recesses 36B. The first polymers 37A and the second polymers 37B that are deposited in the lower portions of the first recesses 36, are simultaneously removed. Therefore, the bulb-shaped second recesses 36B are formed with uniform profiles.

The method for fabricating the semiconductor device having bulb-shaped recesses reduces plasma damage, and prevents the bulb-shaped recesses from being formed with a size that is smaller than desired or not being formed at all. Accordingly, reliability of the resulting device is improved.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, the method comprising:
    etching a portion of a substrate to form a recess;
    forming a polymer layer that fills a lower portion of the recess;
    forming sidewall spacers on sidewalls of the remaining portion of the recess;
    removing the polymer layer; and
    isotropically etching the lower portion of the recess to form a bulb-shaped recess having a width that is larger than a width of the lower portion of the recess.

2. The method of claim 1, wherein forming the polymer layer includes:
    forming a polymer layer that fills the recess over the substrate; and
    performing an etch back process such that the polymer layer remains in the lower portion of the recess.

3. The method of claim 2, wherein the polymer layer includes a polymer containing at least 80% of carbon.

4. The method of claim 3, wherein the polymer layer includes amorphous carbon.

5. The method of claim 4, wherein performing the etch back process includes providing to the polymer layer a gas mixture of oxygen and nitrogen at a flow rate having a range from approximately 10 sccm to approximately 1,000 sccm.

6. The method of claim 1, wherein the polymer layer has a higher etch selectivity than the sidewall spacers and the substrate to facilitate removal of the polymer layer.

7. The method of claim 6, wherein removing the polymer layer includes providing oxygen plasma to the polymer layer.

8. The method of claim 1, wherein forming the recess includes:
   sequentially forming a hard mask layer and an anti-reflective coating layer over the substrate;
   forming a photoresist pattern over the anti-reflective coating layer such that a region where the recess is to be formed is exposed;
   etching the anti-reflective coating layer and the hard mask layer using the photoresist pattern as an etch mask; and
   etching the substrate using a hard mask pattern as an etch mask to form the recess.

9. The method of claim 8, wherein the hard mask pattern includes a stack structure of a dielectric-based hard mask pattern and a polycrystalline silicon-based hard mask pattern.

10. The method of claim 1, wherein the sidewall spacers include a nitride-based material.

11. The method of claim 1, wherein the sidewalls of the recess have a vertical profile.

12. A method for fabricating a semiconductor device, the method comprising:
   etching a portion of a substrate to form a recess having an upper portion and a lower portion;
   forming a polymer layer that fills the lower portion of the recess while exposing the upper portion of the recess;
   forming a film on sidewalls of the upper portion of the recess;
   removing the polymer layer to expose the lower portion of the recess; and
   isotropically etching the exposed lower portion of the recess to form a bulb-shaped recess having a width that is larger than a width of the lower portion of the recess,
   wherein the film on the sidewalls of the upper portion of the recess prevents the sidewalls of the upper portion of the recess from being etched while the exposed lower portion is being etched isotropically.

* * * * *